(12) United States Patent
Takahashi et al.

(10) Patent No.: US 7,659,660 B2
(45) Date of Patent: Feb. 9, 2010

(54) ORGANIC EL PANEL HAVING FILM LAYERS WITH OVERLAP DEVIATIONS

(75) Inventors: Kenichi Takahashi, Yamagata-ken (JP); Daisuke Yaguchi, Yamagata-ken (JP)

(73) Assignee: Tohoku Pioneer Corporation, Yamagata-ken (JP)

( * ) Notice: Subject to any disclaimer, the term of this patent is extended or adjusted under 35 U.S.C. 154(b) by 595 days.

(21) Appl. No.: 11/083,017

(22) Filed: Mar. 18, 2005

(65) Prior Publication Data

US 2005/0206308 A1 Sep. 22, 2005

(30) Foreign Application Priority Data

Mar. 22, 2004 (JP) ............................. 2004-083076

(51) Int. Cl.
H01J 1/62 (2006.01)
H01J 63/04 (2006.01)
(52) U.S. Cl. .................... 313/506; 313/503; 313/504
(58) Field of Classification Search .......... 313/498–512
See application file for complete search history.

(56) References Cited

U.S. PATENT DOCUMENTS

| | | | | |
|---|---|---|---|---|
| 2003/0189400 A1* | 10/2003 | Nishio et al. | ................. | 313/504 |
| 2004/0183435 A1* | 9/2004 | Ohshita | ..................... | 313/506 |
| 2005/0057147 A1* | 3/2005 | Otani | ..................... | 313/504 |
| 2006/0170339 A1* | 8/2006 | Kanno et al. | ................. | 313/506 |

FOREIGN PATENT DOCUMENTS

| | | |
|---|---|---|
| CN | 1391424 A | 1/2003 |
| JP | 2002-203674 A | 7/2002 |
| JP | 2002-367787 | 12/2002 |

* cited by examiner

*Primary Examiner*—Bumsuk Won
(74) *Attorney, Agent, or Firm*—Arent Fox LLP.

(57) ABSTRACT

The present invention is to ensure that when it has been judged that film-formation areas of a plurality of layers laminated on the same luminescent areas of organic EL devices involve a defect, it is possible to exactly find which layer of the multi-laminated layers is a defective layer. The film formation areas of layers to be laminated on luminescent area are formed in a manner such that overlap deviations e1-e3 are intentionally formed.

5 Claims, 5 Drawing Sheets

ORGANIC EL PANEL HAVING FILM LAYERS WITH OVERLAP DEVIATIONS

BACKGROUND OF THE INVENTION

This invention relates to an organic EL (Electroluminescence) panel and a method of manufacturing the same.

The present application claims priority from Japanese Application No. 2004-083076, the disclosures of which are incorporated herein by reference.

An organic EL panel is produced by forming surface emission elements which are organic EL devices (elements) on a substrate, and forming a displaying area by arranging one or more organic EL devices. Each organic EL device is mounted on a substrate and comprises a first electrode, an organic layer including one or more layers of organic compound materials containing at least one organic luminescent layer, and a second electrode, thereby forming a structure with the organic layer interposed between a pair of electrodes.

In such an organic EL panel, film formation areas of layers (such as organic layer) essential for organic EL device(s) are formed corresponding to single or a group of luminescent areas (which may be pixels if display is dot matrix display) to be formed on a substrate. For example, if it is desired to effect light emission of different colors in luminescent area units in order to effect a color display, it is necessary for material layers related to light emission colors to be formed by different materials in different light emission units. However, in forming films in luminescent area units, it is also possible to select luminescent areas on which film formation is performed using an identical material, by employing a film formation mask having a pattern indicating many openings corresponding to selected luminescent areas, thereby forming film formation areas corresponding to the selected luminescent areas by virtue of mask pattern.

On the other hand, in order to improve luminescent performance and to ensure various luminescent colors for organic EL devices, the above-mentioned organic layer and electrode layers are sometimes required to be formed into multi-layered structures. At this time, the foregoing film formation mask is employed to form laminated layers in the film formation areas corresponding to luminescent areas.

For example, Japanese Unexamined Patent Application Publication Hei 2002-367787 discloses an organic EL panel shown in FIG. 1A. As shown, on one surface of a substrate 1 there are formed a plurality of first electrodes 2 consisting of a transparent conductive material such as ITO. A plurality of insulating films 3 are arranged to cover the exposed portions (between every two adjacent first electrodes 2) of the substrate 1 as well as part of the periphery of each first electrode 2, thereby dividing the substrate into a plurality of small sections and thus forming a plurality of luminescent areas 45R, 45G, and 45B on the first electrodes 2. Then, a hole injection layer 40 and a hole transporting layer 41 are formed to cover the first electrodes and spaces therebetween, while areas 60R, 60G, and 60B are selected corresponding to different colors, followed by forming in the respective areas luminescent layers 42R, 42G, and 42B, electron transporting layers 43R, 43G, and 43B, and electron injection layers 44R, 44G, and 44B. Finally, second electrodes 50 are formed over these layers.

In this way, the luminescent layers 42R, 42G, and 42B, the electron transporting layers 43R, 43G, and 43B, and the electron injection layers 44R, 44G, and 44B together form the afore-mentioned organic layer in an organic EL panel, thus constituting film formation areas corresponding to the luminescent areas 45R, 45G, and 45B.

In the above-discussed prior art, if only single one luminescent area is considered, since the luminescent layer, the electron transporting layer, and an electron injection layer are formed using an identical pattern of the same film formation mask, it is preferred that the formed three layers are overlapped one upon another without any overlap deviation. However, since the film formation mask and the substrate have to be positioned relatively to each other for forming each film layer, some troubles in positioning operation will occur and thus film formation area in a certain specific layer will suffer a considerable overlap deviation, resulting in a film formation failure.

Usually, it is supposed that various film formation errors will occur in a film formation process using a film formation mask, so that the pattern of a film formation mask should be set such that the length and width of film formation area are somewhat longer than the length and width of luminescent area. However, as shown in FIG. 1B, if a certain specific layer b of laminated layers a-c is deviated from its film formation area and thus located away from a luminescent area s, trouble will occur in the luminescent state of the luminescent area s. As a result, such film formation is usually considered as a film formation failure which must be removed.

Usually, a film formation failure can be detected by an eye-inspection using a microscope or through an image processing. If an inspected state is like that shown in FIG. 1B, it is possible to judge that such a state is a film formation failure. However, it is extremely difficult to judge which layer among the laminated layers has been greatly deviated and thus is a defective layer. On the other hand, in a process of manufacturing an organic EL panel, once a film formation failure occurs at a certain step, similar failures will probably occur in later steps. Accordingly, it is extremely important to detect a specific layer in which a film formation failure has occurred, to re-check a film formation process for forming the specific layer, so as to improve the yield of manufacturing process.

SUMMARY OF THE INVENTION

The present invention has been accomplished to solve the above-discussed problem and it is an object of the invention to provide an improved organic EL panel comprising a substrate and organic EL devices (each formed by interposing an organic layer containing an organic luminescent layer between a pair of electrodes) formed on the substrate, and to provide a method of manufacturing the improved organic EL panel, so that when it is judged that film formation areas of a plurality of layers laminated on an identical luminescent area of an organic EL panel involves a film formation failure, it is possible to determine which layer among the laminated layers involves the film formation failure.

In order to achieve the above objects, an organic EL panel and its manufacturing method according to the present invention are characterized by at least the following aspects.

According to one aspect of the present invention, there is provided an improved organic EL panel having a substrate and organic EL devices formed on the substrate, each organic EL device including a pair of electrodes, an organic layer interposed between the pair of electrodes, with the organic layer being formed by laminating a plurality of film layers including an organic luminescent layer. In particular, film formation areas of a plurality of layers which are essential for forming organic EL devices and laminated on identical luminescent areas of the organic EL devices are formed to have overlap deviations which can be used to identify each of the plurality of film layers.

According to another aspect of the present invention, there is provided an improved method of manufacturing an organic EL panel having a substrate and organic EL devices formed on the substrate, each organic EL device including a pair of electrodes, an organic layer interposed between the pair of electrodes, with the organic layer being formed by laminating a plurality of film layers including an organic luminescence functional layer. The method comprises a film formation step in which film formation areas of layers which are essential for forming organic EL devices are formed on luminescent areas of the organic EL devices corresponding to the pattern of a film formation mask having a plurality of openings. Further, in the film formation step, overlap deviations which can be used to identify each of the plurality of film layers, are formed on the film formation areas of several layers laminated on an identical luminescent area.

BRIEF DESCRIPTION OF THE DRAWINGS

These and other objects and advantages of the present invention will become clear from the following description with reference to the accompanying drawings, wherein.

DETAILED DESCRIPTION OF THE PREFERRED EMBODIMENTS

Figure 1A:
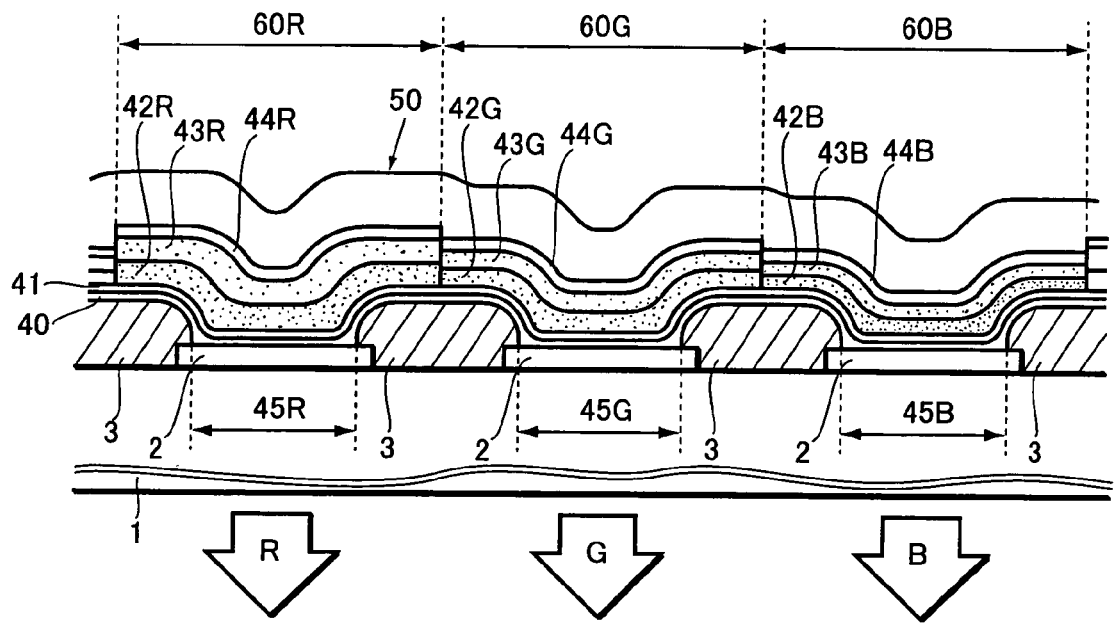
FIGS. 1A and 1B are explanatory views showing a prior art.
Figure 1B:
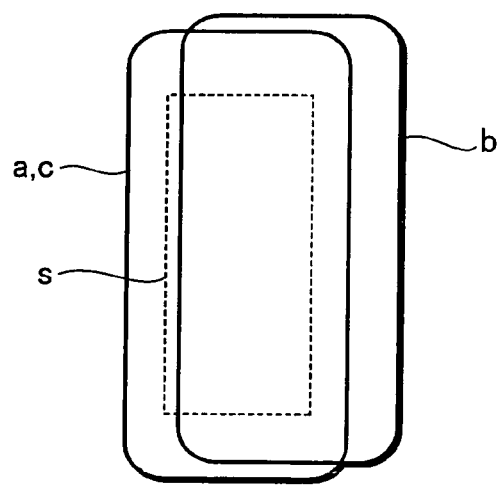
Figure 2:
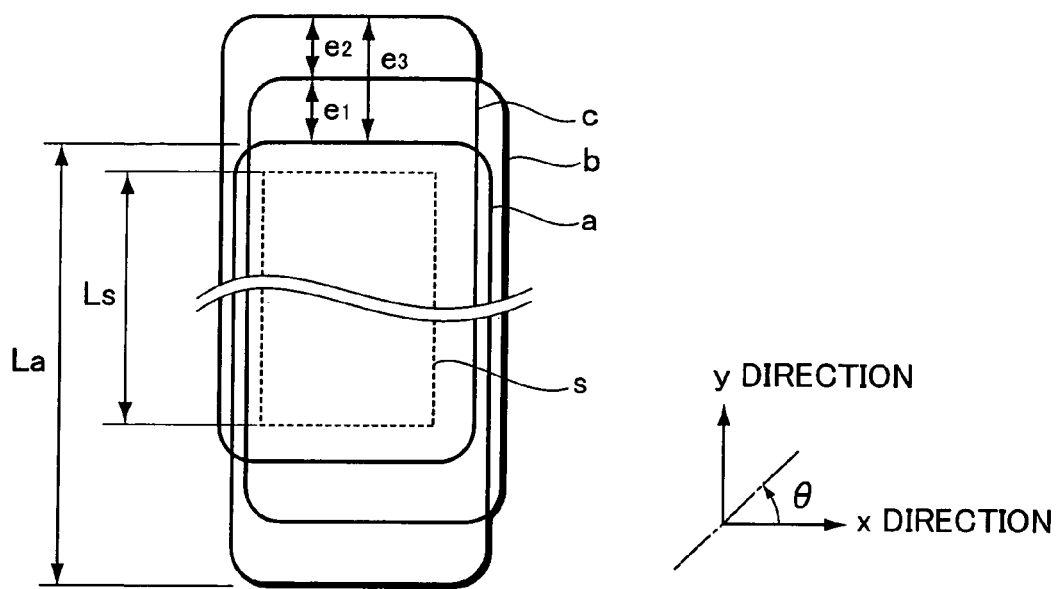
FIGS. 2A and 2B are explanatory views showing an organic EL panel formed according to an embodiment of the present invention.
Figure 2:
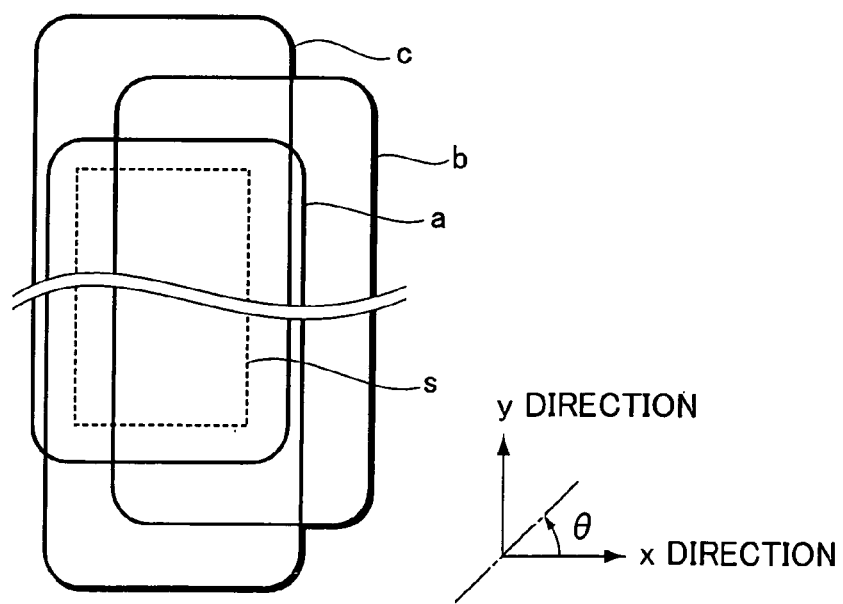

A preferred embodiment of the present invention will be described below with reference to the accompanying drawings. FIGS. 2A and 2B are explanatory views showing an organic EL panel formed according to one embodiment of the present invention. As shown, an organic EL panel obtained in a predetermined film formation process has film formation areas on a plurality of layers a, b, and c laminated on an identical luminescent area s of the organic EL panel. After film formation, it is possible to observe film formation states shown in FIGS. 2A and 2B by using a microscope or through an image processing. Here, the plurality of layers a, b, and c are all essential elements for forming organic EL devices and serving as unit surface emission elements of the organic EL panel, and can act as various layers forming an organic layer (containing an organic luminescent functional layer) or act as electrode layers.

In the organic EL panel according to the present embodiment of the present invention, the film formation areas a-c are formed in a manner such that they are overlapped by one another and mutually deviated (overlap and overlap deviation) so as to be distinguishable from one another. Here, "overlap deviation" means an "off-set amount." Namely, as shown in FIG. 2A, the film formation area of layer b deviates e1 from the film formation area of layer a, the film formation area of layer c deviates e2 from the film formation area of layer b and deviates e3 from the film formation area of layer a. Although the present embodiment illustrated in FIG. 2A shows that the overlap deviations of the layers are in the same direction, the present invention is by no means to be limited by such specific example. Actually, the overlap deviations of the layers are allowed to be in different directions, provided that different layers are distinguishable from one another. Further, although the present embodiment illustrated in FIG. 2A shows that three layers a-c are overlapped by one another and mutually deviated, it is also possible to form "overlap deviation" with all layers laminated on the luminescent area s, or with at least two layers selected from these layers, thereby making it possible to distinguish these layers from one another.

As mentioned above, film formation area of each layer to be formed corresponding to the luminescent area s is usually set larger than the luminescent area s by having an extra portion in length and width directions. Therefore, an amount of the above-mentioned overlap deviation can be set by making use of such extra portions. Namely, as shown in FIG. 2A, the length La of the film formation area of the layer a is set longer than the length Ls of the luminescent area s, thereby setting the overlap deviation amounts e1-e3 within the range of such an extra portion. Further, in order to form recognizable overlap deviations, it is preferable that extra portions (as compared with the luminescent area s) of layers a-c be set large in overlap deviation directions, thus increasing each of the overlap deviations e1-e3. More preferably, the overlap deviations e1-e3 are set larger than estimated overlap deviation amounts caused due to film formation errors, so as to ensure that the overlap deviations e1-e3 set in advance will not become unrecognizable due to film formation errors (such as mask positioning error, mask designing error, and deposition error).

FIG. 2A shows an appropriate film formation state in which the respective layers a-c can cover the luminescent area s. On the other hand, FIG. 2B shows that a certain layer b has deviated from the luminescent area s and film formation at this time can be judged as a film formation failure. At this time, since the above-described overlap deviations e1-e3 are formed, it is possible to judge that layer b is a film formation failure. In this way, by reviewing a step of forming layer b and searching out a cause responsible for the film formation failure, it is possible to prevent subsequent film formation steps from similar troubles.

Moreover, since the above-described overlap deviations are formed in the aforementioned lamination order in the same direction, it is possible to effectively recognize the respective layers. Namely, when the film formation areas are to be laminated on the luminescent area s in the order of layers a, b, c, an operation necessary at this time is only to successively form these overlap deviations in their lamination order in the longitudinal direction, as shown in FIG. 2A. Therefore, if layer b is a film formation failure, such layer can be detected by judging in accordance with such overlap deviation order. However, the direction in which these overlap deviations are formed should not be limited to the longitudinal direction (y direction) shown in FIG. 2A. Actually, the above-described overlap deviations can also be arranged in the lateral direction (x direction) or in a rotated direction θ.

In fact, the present embodiment of the present invention can be effectively applied to an example in which the film formation areas are formed by an identical pattern of a single film formation mask. At this time, the above-described overlap deviations may be formed by intentionally deviating the position of the film formation mask at the time of forming each layer. However, the present invention should not be limited to such a specific example. Actually, it is also possible to use a film formation mask having a common pattern capable of forming film formation areas on the respective layers, or to form a pattern (capable of intentionally forming the above-described overlap deviations) on each film formation mask.

Figure 3:
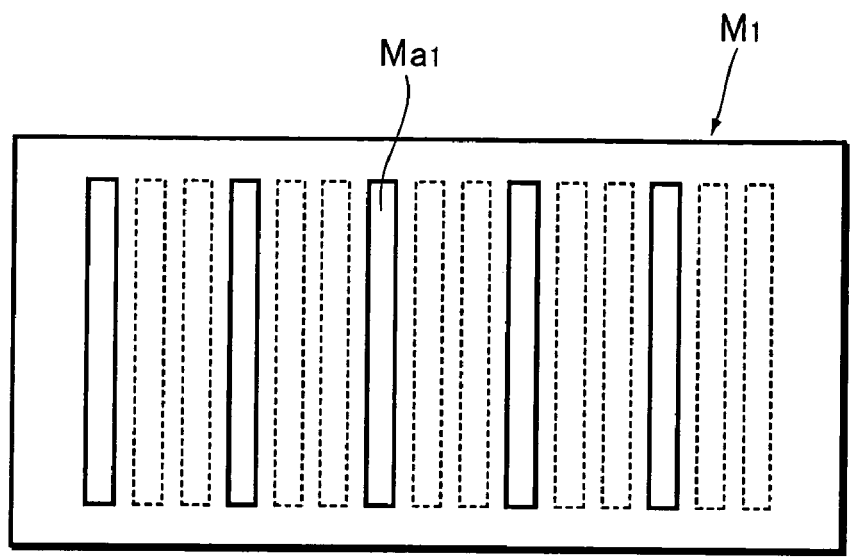
FIGS. 3A and 3B are explanatory views showing masks for use in manufacturing organic EL panel according to an embodiment of the present invention.
Figure 3:
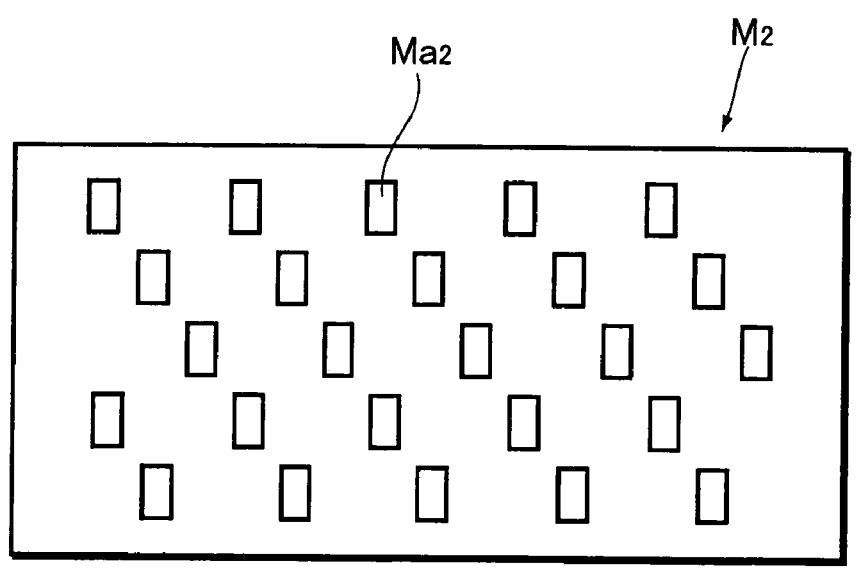

A film formation mask used in the present invention can be in any desired pattern. For example, it is possible to use a film formation mask $M_1$ having a stripe-like pattern containing linear openings $Ma_1$ shown in FIG. 3A. Further, it is also possible to use another film formation mask $M_2$ having an alternate pattern containing openings $Ma_2$ corresponding to a group of luminescent areas, as shown in FIG. 3B.

Figure 4A:
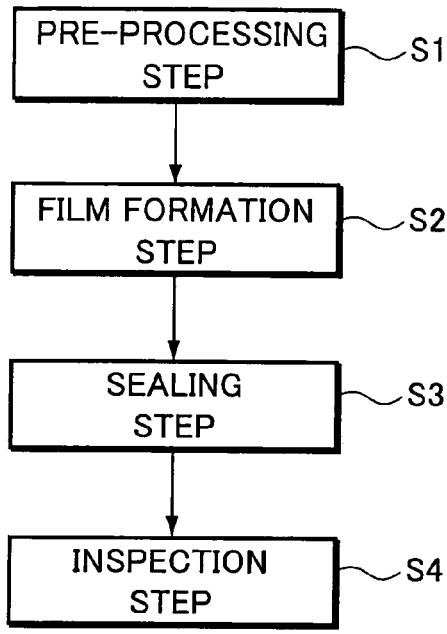
FIGS. 4A and 4B are flow charts showing a method of manufacturing organic EL panel according to an embodiment of the present invention.
Figure 4B:
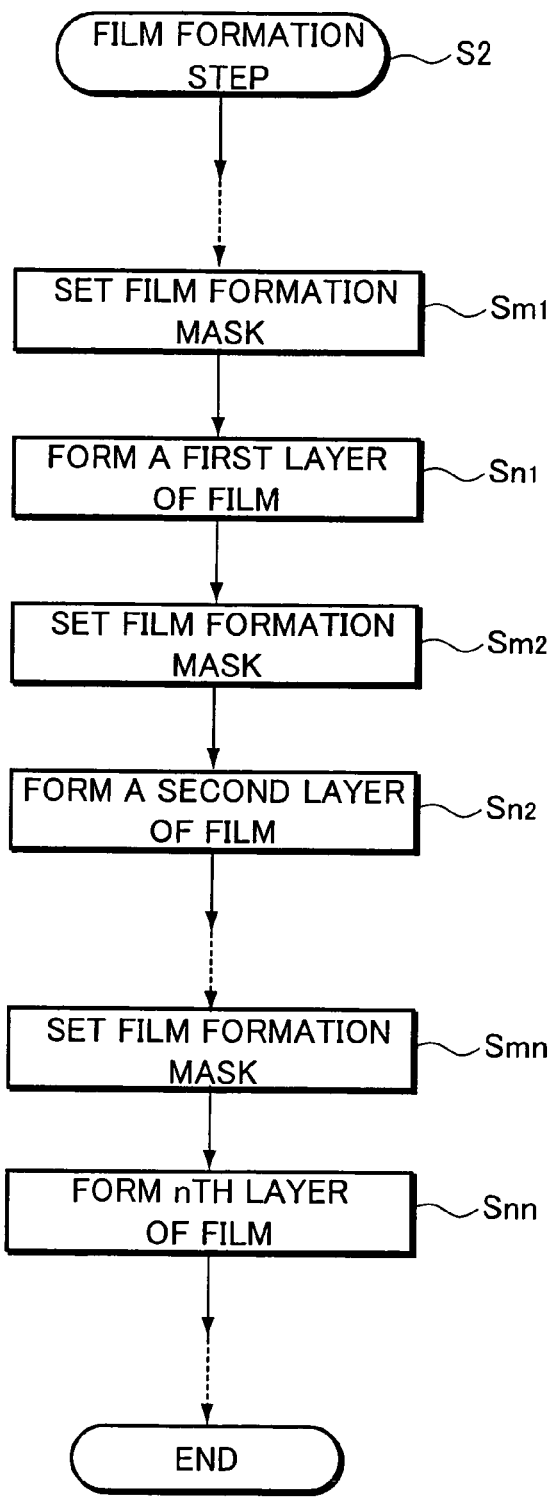

FIGS. 4A and 4B are flow charts briefly showing a method of forming an organic EL panel according to one embodiment of the present invention. In fact, the method of forming an organic EL panel according to the present invention is almost the same as a conventional method (including pre-processing step S1→film formation step S2→sealing step S3→inspection step S4, as shown in FIG. 4A,), with only the film formation step S2 being different from a conventional one. In film formation step S2, when film formation areas of layers forming an organic EL device are laminated on the luminescent area s of the organic EL device corresponding to the pattern of a film formation mask, recognizable overlap deviations (for example, overlap deviations e1-e3) are formed on a plurality of layers (for example, layers a-c) to be formed on the identical luminescent area s. Subsequently, a sealing step S3 is performed and an inspection step S4 is thus carried out to perform an eye-inspection or an image-processing on a film formation state of the film formation areas.

In the film formation step S2, film formation is performed by using various materials. However, when laminating layers having an identical pattern (corresponding to the luminescent area) on the luminescent area s, a film formation mask is set (Sm1) as a first step, and then a first layer of film is formed, followed by repeating the film formation (Smn, Snn). Then, if necessary, other layers of films are formed, thereby finishing the film formation step. At this time, when setting the film formation mask (Sm1, Sm2, ..., Smn), the setting position of the film formation mask is shifted intentionally, thereby forming the above-described overlap deviations.

The amounts of the overlap deviations at this time, as described above, are set such that an amount of overlap deviation of each layer is larger than an estimated overlap deviation possibly caused by an film formation error, while a maximum overlap deviation amount is set in a manner such that each film formation area will not go beyond the luminescent area s (some extra areas or free margins are formed between the luminescent area s and each film formation area of the layers a-c).

According to the method of manufacturing the organic EL panel of the present embodiment of the present invention (as described above), it is possible to effectively detect a film formation failure during an eye-inspection or an image processing inspection to be performed after the film formation, without having to add some other additional steps as compared with a conventional process except that the film formation mask is set in the manner as described above.

Next, description will be given to explain, as an embodiment of the present invention, an organic EL panel having linearly arranged luminescent areas containing three colors of RGB. In detail, a film formation mask is used which has a stripe-like pattern including a plurality of linear openings, and linear areas of several film layers are formed on the luminescent area by painting different colors on different liner areas.

Figure 5:
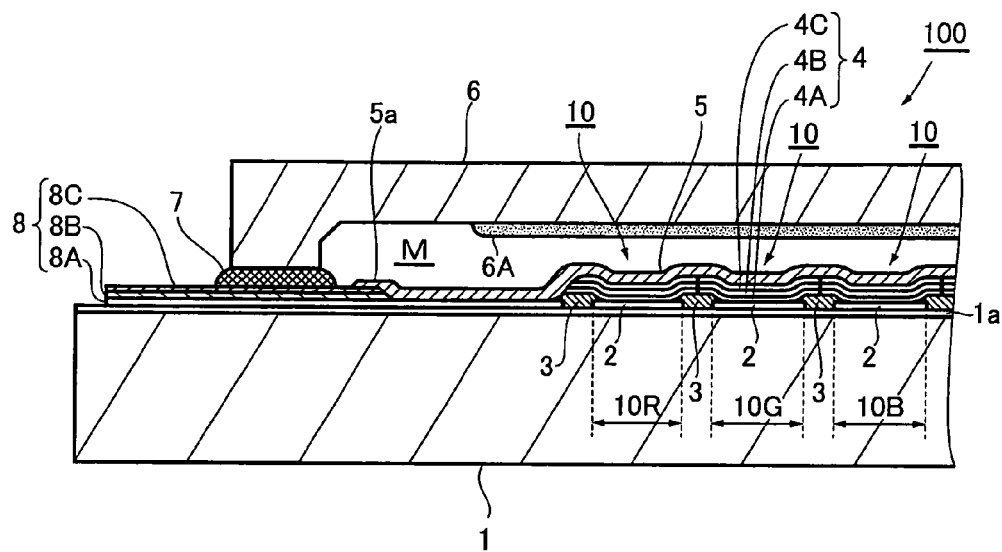
FIG. 5 is an explanatory view showing one embodiment of the present invention.

FIG. 5 is an explanatory view (a cross sectional view) showing the structure of an organic EL panel 100 formed according to the present embodiment. As shown, the organic EL panel 100 is formed by interposing an organic layer 4 containing an organic luminescent layer between first electrodes 2 on one hand and second electrodes 5 on the other, thereby forming a plurality of organic EL devices 10 on the substrate 1. In an example shown in FIG. 5, a silicone coating layer la is formed on the substrate 1, and a plurality of first electrodes 2 consisting of transparent electrode material such as ITO and serving as cathodes are formed on the silicon coating layer 1a. Further, second electrodes 5 consisting of a metal and serving as anodes are formed above the first electrodes 2, thereby forming a bottom emission type panel producing light from the substrate 1 side. Moreover, the panel also contains an organic layer 4 including a hole transporting layer 4A, a luminescent layer 4B, and an electron transporting layer 4C. Then, a cover 6 is bonded to the substrate 1 through an adhesive layer 7, thereby forming a sealing space M on the substrate 1 and thus forming a display section consisting of organic EL devices 10 within the sealing space M.

In the example shown in FIG. 5, the organic EL devices 10 are formed such that the first electrodes 2 are separated by a plurality of insulating strips 3, thereby forming luminescent units (10R, 10G, 10B) under the first electrodes 2. Moreover, a desiccant layer 6A is attached to the inner surface of the cover 6, thereby preventing the organic EL devices 10 from getting deteriorated due to moisture.

Moreover, along the edge of the substrate 1 there is formed a first electrode layer 8A using the same material and the same step as forming the first electrodes 2, which is separated from the first electrodes 2 by the insulating strips 3. Further, on the lead-out portion of the first electrode layer 8A there is formed a second electrode layer 8B containing a silver alloy and forming a low-resistant wiring portion. In addition, if necessary, a protection coating layer 8C consisting of IZO or the like is formed on the second electrode layer 8C. In this way, a lead-out electrode 8 can be formed which consists of the first electrode layer 8A, the second electrode layer 8B, and the protection coating 8C. Then, an end portion 5a of each second electrode 5 is connected to the lead-out electrode 8 within the sealing space M.

Here, although the lead-out electrode of each first electrode 2 is not shown in the drawing, it is possible to elongate each first electrode 2 and lead the same out of the sealing space M. Actually, such lead-out electrode can also be formed into an electrode layer containing Ag alloy or the like and constituting a low resistant wiring portion.

In the organic EL panel 100 of the present embodiment, since the respective layers (the hole transporting layer 4A, the luminescent layer 4B, and the electron transporting layer 4C) of the organic layer 4 are painted with different colors, it is possible to form film formation areas corresponding to the luminescent units 10R, 10G, and 10B. Here, although the present embodiment shows an organic layer 4 having a three-layer structure, the present invention should not be limited by three-layer structure. In fact, it is possible to form a structure including, from the anode side, a hole injection layer (common to RGB)/a first hole transporting layer (common to RGB)/a second hole transporting layer (painted with different colors)/a first organic luminescent layer (painted with different colors)/a second organic luminescent layer (painted with different colors)/a first electron transporting layer (painted with different colors)/a second electron transporting layer (common to RGB)/an electron-injection layer (common to RGB)/(cathode). At this time, four layers including the second hole transporting layer, the first organic luminescent layer, the second organic luminescent layer, and the first electron transporting layer, all painted with different colors, are formed as film formation areas corresponding to the luminescent units 10R, 10G and 10B, on the luminescent units 10R, 10G, and 10B.

Figure 6:
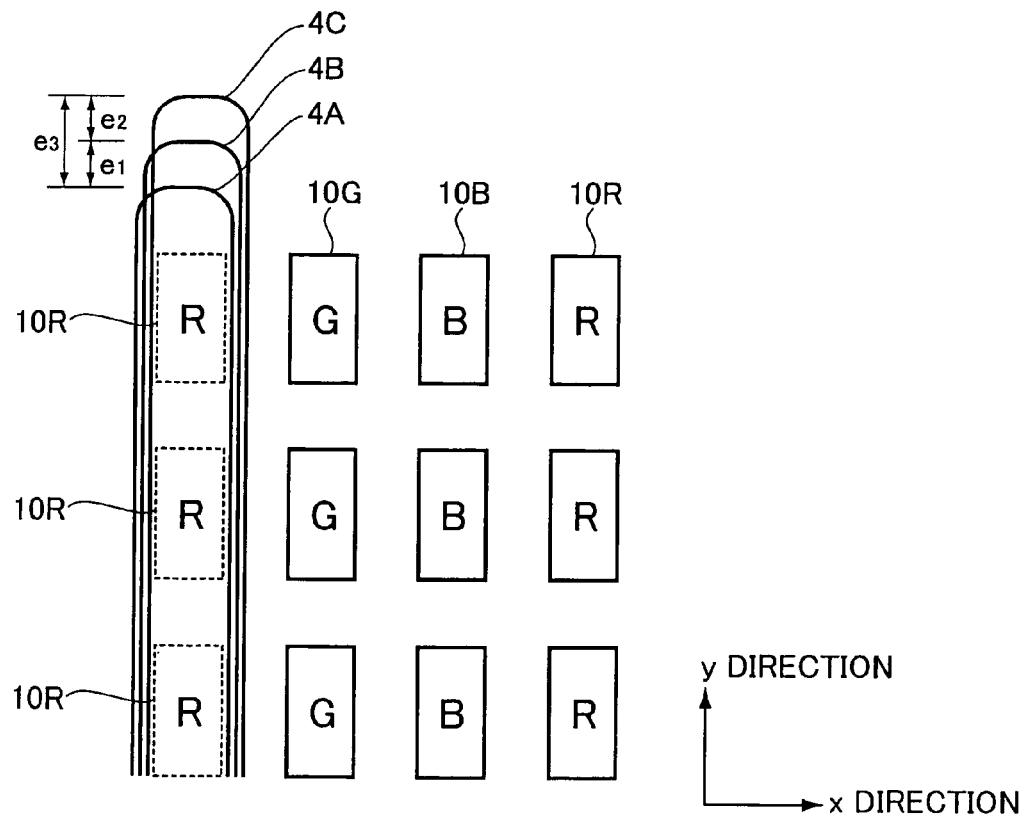
FIG. 6 is an explanatory view showing another embodiment of the present invention.

Then, as shown in FIG. 6, with the layers to be painted with different colors, film formation areas of layers laminated on the same luminescent units 10R (10G, 10B), are formed to have overlap deviations for distinguishing one layer from another. In other words, the respective film formation areas of the hole transporting layer 4A, the luminescent layer 4B, and the electron transporting layer 4C are formed on a linearly arranged area covering a plurality of linearly arranged luminescent units R. On the other hand, several overlap deviations e1, e2, and e3 are formed along the longitudinal direction (y direction) of the linear area. Further, in forming the film formation areas, it is allowed to use the film formation mask $M_1$ having a pattern including a plurality of linear openings $M_{a1}$ shown in FIG. 3A, whereas the position of the film formation mask $M_1$ is successively shifted for each layer along the longitudinal direction of the opening $M_{a1}$.

Further, as shown in FIG. 6, when linearly arranging the luminescent units 10R (10G, 10B) of the same color to form a linear film formation area, it is possible to form each film formation area with a relatively large extra portion in the longitudinal direction (y direction) of the luminescent unit 10R (10G, 10B), thereby making it possible to effectively form the above-described overlap deviations e1, e2, and e3 in y direction.

The present embodiment makes it possible to obtain the same effect as obtainable from the above-described embodiment. Namely, when a film formation failure is judged during an inspection performed after the film formation, it is possible to detect which layer contains such film formation failure by virtue of the overlap deviations e1-e3. In this way, by checking the film formation step which has produced a layer containing the film formation failure and searching out a cause responsible for the film formation failure, it is possible to prevent any similar trouble during subsequent film formation steps.

Next, description will be given to explain in detail the organic EL panel 100 and the method of manufacturing the same, according to one embodiment of the present invention.

a. Electrodes

Either the first electrodes 2 or the second electrodes 5 are set as cathode side, while the opposite side is set as anode side. The anode side is formed by a material having a higher work function than the cathode side, using a transparent conductive film which may be a metal film such as chromium (Cr), molybdenum (Mo), nickel (nickel), and platinum (Pt), or a metal oxide film such as ITO and IZO. In contrast, the cathode side is formed by a material having a lower work function than the anode side, using a metal having a low work function, which may be an alkali metal (such as Li, Na, K, Rb, and Cs), an alkaline earth metal (such as Be, Mg, Ca, Sr, and Ba), a rare earth metal, a compound or an alloy containing two or more of the above elements, or an amorphous semiconductor such as a doped polyaniline and a doped polyphenylene vinylene, or an oxide such as $Cr_2O_3$, NiO, and $Mn_2O_5$. Moreover, when the first electrodes 2 and the second electrodes 5 are all formed by transparent materials, it is allowed to provide a reflection film on one electrode side opposite to the light emission side.

The lead-out electrodes (the lead-out electrode 8 and the lead-out electrode of the first electrodes 2) are connected with drive circuit parts driving the organic EL panel 100 or connected with a flexible wiring board. However, it is preferable for these lead-out electrodes to be formed as having a low resistance. Namely, the lead-out electrodes can be formed by laminating low resistant metal electrode layers which may be Ag, Cr, Al, or their alloys, or may be formed by single one electrode of low resistant metal.

b. Organic Layer

Although the organic layer 4 comprises one or more layers of organic compound materials including at least one organic luminescent layer, its laminated structure can be in any desired arrangement. Usually, as shown in FIG. 5, there is a laminated structure including, from the anode side towards the cathode side, a hole transporting layer 4A, a luminescent layer 4B, and an electron transporting layer 4C. Each of the hole transporting layer 4A, the luminescent layer 4B, and the electron transporting layer 4C can be in a single-layer or a multi-layered structure. Moreover, it is also possible to dispense with the hole transporting layer 4A and/or the electron transporting layer 4C. On the other hand, if necessary, it is allowed to insert other organic layers including a hole injection layer, an electron injection layer and a carrier blocking layer. Here, the hole transporting layer 4A, the luminescent layer 4B, and the electron transporting layer 4C can be formed by any conventional materials (it is allowed to use either a high molecular material or a low molecular material).

With regard to a luminescent material for forming the luminescent layer 4B, it is allowed to make use of a luminescence (fluorescence) when the material returns from a singlet excited state to a base state or a luminescence (phosphorescence) when it returns from a triplet excited state to a base state through a singlet base state.

c. Covering Member (Covering Film)

Further, the organic EL panel according to the present invention is a panel formed by tightly covering organic EL devices 10 with a covering member 6 made of metal, glass, or plastic. Here, the covering member may be a piece of material having a recess portion (a one-step recess or a two-step recess) formed by pressing, etching, or blasting. Alternatively, the covering member may be formed by using a flat glass plate and includes an internal covering space M to be formed between the flat glass plate and the support substrate by virtue of a spacer made of glass (or plastic). In practice, the internal covering space may either be an air-tight space or can be filled with a filler such as a high molecular elastomer, resin or silicon oil.

In order to tightly seal the organic EL devices 10, it is also possible for the covering member 6 to be replaced by a sealing film to cover the organic EL devices 10. The covering film can be formed by laminating a single layer of protection film or a plurality of protection films, and is allowed to be formed by either an inorganic material or an organic material. Here, an inorganic material may be a nitride such as SiN, AlN, and GaN, or an oxide such as SiO, $Al_2O_3$, $Ta_2O_5$, ZnO, and GeO, or an oxidized nitride such as SiON, or a carbonized nitride such as SiCN, or a metal fluorine compound, or a metal film, etc. On the other hand, an organic material may be an epoxy resin, or an acryl resin, or a paraxylene resin, or a fluorine system high molecule such as perfluoro olefin and perfluoro ether, or a metal alkoxide such as $CH_3OM$ and $C_2H_5OM$, or a polyimide precursor, or a perylene system compound, etc. In practice, the above-mentioned lamination and material selection can be carried out by appropriately designing the organic EL devices.

d. Adhesive Agent

An adhesive agent forming the adhesive layer 7 may be a thermal-setting type, a chemical-setting type (2-liquid mixture), or a light (ultraviolet) setting type, which can be formed by an acryl resin, an epoxy resin, a polyester, a polyolefine.

Particularly, it is preferable to use an ultraviolet-setting epoxy resin adhesive agent which is quick to solidify without a heating treatment.

e. Desiccating Material

Desiccating material 6A may be a physical desiccating agent such as zeolite, silica gel, carbon, and carbon nanotube; a chemical desiccating agent such as alkali metal oxide, metal halogenide, peroxide chlorine; a desiccating-agent formed by dissolving an organic metallic complex in a petroleum system solvent such as toluene, xylene, an aliphatic organic solvent and the like; and a desiccating agent formed by dispersing desiccating particles in a transparent binder such as polyethylene, polyisoprene, polyvinyl thinnate.

f. Various Types of Organic EL Display Panels

The organic EL panel 100 of the present invention can have various types without departing from the scope of the invention. For example, the organic EL panel 100 can have a passive drive type based on an electrode arrangement shown in FIG. 5, as well as an active drive type capable of TFT driving each organic EL device 10 acting as a luminescent unit. Further, the light emission type of an organic EL device 10 can be a bottom emission type emitting light from the substrate 1 side, or a top emission type emitting light from a side opposite to the substrate 1. Moreover, the EL display panel may be a single color display or a multi-color display. In practice, in order to form a multi-color display panel, it is allowed to adopt a discriminated painting method or a method in which a single color (white or blue) luminescence functional layer is combined with a color conversion layer formed by a color filter or a fluorescent material (CF method, CCM method), a photograph breeching method which realizes a multiple light emission by emitting an electromagnetic wave or the like to the light emission area of a single color luminescent functional layer, or SOLED (transparent Stacked OLED) method in which two or more colors of unit display areas are laminated to form one unit display area.

g. Example of Manufacturing Method

A thin film of ITO or the like is formed on a glass-substrate 1 through vapor deposition, sputtering or the like, and formed into a desired pattern though photolithography or the like, thereby forming a plurality of first electrodes 2. Further, patterning is performed to form insulating films 3 and allow the openings of the luminescent units 10R, 10G, 10B to be connected with the first electrodes 2 (pre-processing step S1).

Next, an organic layer 4 is formed by a wet process such as spin coating, dipping, screen printing, ink jet printing and the like, or a dry process such as vapor-deposition, Laser-Induced-Thermal-Imaging (LITI), and the like. In detail, a hole transporting layer 4A, a luminescent layer 4B, and an electron transporting layer 4C are successively laminated on the luminescent units 10R, 10G, 10B through vapor deposition.

On such occasion, a coating method utilizing a film-formation mask is used to coat film layers with different colors. Thus, materials presenting light emissions of three colors RGB or a composite material consisting of several organic substances, are formed into film formation areas corresponding to the luminescent units RGB. At this time, the film-formation mask is set in a manner such that the aforementioned overlap deviations may be formed. In addition, if film formation of one layer in one luminescent area is carried out twice or more utilizing the same material, it is possible to avoid an incomplete film within the luminescent area.

Finally, the second electrodes 5 consisting of metal film and serving as cathodes are formed into strips orthogonal to the first electrodes 2, thereby forming organic EL devices 10 in a dot matrix array on the orthogonal intersections of the first electrodes and the second electrodes (film formation step S2).

Subsequently, spacers (preferably, made of glass or plastic) having a particle size of 1-300 μm are mixed at an appropriate ratio (0.1 to 0.5 weight %) into an amount of ultraviolet-setting epoxy resin adhesive so as to obtain an adhesive agent, which is then applied to an adhesive agent-coating area on the substrate 1, utilizing a dispenser or the like. Further, in an atmosphere of an inert gas such as argon gas, a covering member 6 is bonded to the substrate 1 through the adhesive agent, followed by irradiating such adhesive agent with an ultraviolet light so as to harden the same. In this way, it is possible to cover the organic EL devices 10 with an inert gas such as argon gas contained within a covering space between the covering member 6 and the substrate 1 (covering step S3).

Then, defective products will be detected and eliminated through an inspection step (S4) which can be an eye-observation using a microscope, an image processing or the like, thereby obtaining an organic EL panels as a final product.

According to the above-discussed embodiment or example of the present invention, once it has been judged that film formation areas of a plurality of layers laminated on the same luminescent area of an organic EL panel involves a defect, it is possible to find which layer of the multi-laminated layers involves such a defect. In this way, by checking the film-forming process which has produced such defective layer, it is possible to prevent same film-forming defect from occurring later, so as to improve the reliability of the organic EL panel, and to improve the production yield, thereby reducing the production cost.

In addition, the above-described embodiment or example of the present invention can be utilized not only for detecting, as mentioned above, a certain defective film layer, but also for measuring the film thickness of a specific layer.

While there has been described what are at present considered to be preferred embodiments of the present invention, it will be understood that various modifications may be made thereto, and it is intended that the appended claims cover all such modifications as fall within the true spirit and scope of the invention.

What is claimed is:

1. An organic EL panel having a substrate and organic EL devices formed above the substrate, each organic EL device including a pair of electrodes, an organic layer interposed between a pair of electrodes, said organic layer being formed by laminating a plurality of film layers including an organic luminescent layer, wherein film formation areas are formed to have each of the plurality of film layers to include overlap deviations from other layers of the plurality of film layers, and the overlap deviations are used to identify each of the plurality of film layers, wherein the overlap deviations are formed in the same direction in the order of layer lamination, wherein the film formation areas occur at discrete and regularly spaced positions, wherein there is an estimated deviation amount for each film layer, and wherein an amount of an overlap deviation for each film layer is larger than the estimated deviation for the layer.

2. The organic EL panel according to claim 1, wherein the plurality of layers are organic layers.

3. The organic EL panel according to claim 1, wherein the film formation areas are linear areas formed on luminescent areas which are linearly arranged, the overlap deviations are formed along the longitudinal direction of the linear pattern area.

4. An organic EL panel having a substrate and organic EL devices formed above the substrate, each organic EL device including a pair of electrodes, an organic layer interposed between a pair of electrodes, said organic layer being formed by laminating a plurality of film layers including an organic luminescent layer, wherein film formation areas are formed to have each of the plurality of film layers to include overlap deviations from other layers of the plurality of film layers, and the overlap deviations are used to identify each of the plurality of film layers, wherein the film formation areas are linear areas formed on luminescent areas which are linearly arranged, the overlap deviations are formed along a longitudinal direction of the linear arrangement of luminescent areas, wherein the film formation areas occur at discrete and regularly spaced positions, wherein there is an estimated deviation amount for each film layer, and wherein an amount of an overlap deviation for each film layer is larger than the estimated deviation for the layer.

5. The organic EL panel according to claim 4, wherein the plurality of layers are organic layers.

* * * * *